(12) United States Patent
Todoroki

(10) Patent No.: US 6,738,941 B1
(45) Date of Patent: May 18, 2004

(54) DATA ERROR CORRECTION SYSTEM

(75) Inventor: Toshiya Todoroki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/471,265

(22) Filed: Dec. 23, 1999

(30) Foreign Application Priority Data

Dec. 28, 1998 (JP) .......................................... 10-374503

(51) Int. Cl.$^7$ ............................................. H03M 13/29
(52) U.S. Cl. ...................................... 714/755; 714/795
(58) Field of Search ................................. 714/755, 795

(56) References Cited

U.S. PATENT DOCUMENTS

| | | | | |
|---|---|---|---|---|
| 5,208,816 A | * | 5/1993 | Seshardi et al. ............ | 714/795 |
| 5,606,569 A | * | 2/1997 | MacDonald et al. ........ | 714/758 |
| 5,673,291 A | * | 9/1997 | Dent .......................... | 329/304 |
| 5,710,784 A | * | 1/1998 | Kindred et al. ............. | 375/262 |
| 5,790,592 A | * | 8/1998 | Baik .......................... | 370/342 |
| 5,917,837 A | * | 6/1999 | Stein .......................... | 714/758 |
| 5,983,382 A | * | 11/1999 | Pauls ......................... | 370/260 |
| 5,983,383 A | * | 11/1999 | Wolf .......................... | 714/755 |
| 6,029,264 A | * | 2/2000 | Kobayashi et al. ......... | 714/755 |
| 6,094,465 A | * | 7/2000 | Stein et al. ................. | 375/341 |
| 6,108,372 A | * | 8/2000 | Tidemann et al. .......... | 375/225 |
| 6,134,694 A | * | 10/2000 | Uebayashi et al. ......... | 714/751 |
| 6,161,210 A | * | 12/2000 | Chen et al. ................. | 375/262 |
| 6,182,261 B1 | * | 1/2001 | Haller et al. ................ | 714/758 |
| 6,292,920 B1 | * | 9/2001 | Nakano ...................... | 714/774 |
| 6,366,624 B1 | * | 4/2002 | Balachandran et al. ..... | 375/262 |

FOREIGN PATENT DOCUMENTS

| | | |
|---|---|---|
| CA | 2020899 | 2/1991 |
| EP | 0 413 505 A1 | 2/1991 |
| JP | 10-224233 | 8/1998 |
| JP | 2000-165260 | 6/2000 |
| JP | 2000-183758 | 6/2000 |

OTHER PUBLICATIONS

Paaske, "Improved Decoding for a Concatented Coding System Recommendd by CCSDS", IEEE Transactions on Communications, vol. 38, No. 8, Aug. 1990, p. 1138–1144.* von Berg et al., "Improved Concatenated Coding/Decoding for Deep Space Probes", IEEE GLOBECOM '92, 707–711.*

Paaske, "Alternative to NASA's Concatenated Coding System for the Galileo Mission", IEE Proceedings—Communications, vol. 141, No. 4, Aug. 1994, pp. 229–232.*

Hagenauer et al., "Iterative Decoding of Binary Block and Convolutional Codes", IEEE Transactions on Information Theory, vol. 42, No. 2, Mar. 1996, pp. 429–445.*

Aitsab et al., "Performance of Concatenated Reed–Solomon/Convolutional Codes with Iterative Decoding", IEEE GLOBECOM '97, pp. 934–938.*

(List continued on next page.)

*Primary Examiner*—Stephen M. Baker
(74) *Attorney, Agent, or Firm*—Sughrue Mion, PLLC

(57) ABSTRACT

A data error correction system, which is capable of executing repeated error correction processing, and which improves the quality of communication links by allowing repeated corrections of errors generated in the transmission line, comprises a Viterbi decoder for decoding a designated encoded data from a buffer and a block decoder for executing decoding of the data corresponding to a length of a block code after being decoded from the Viterbi decoder, when error correction is possible. The data error correction system controls execution of re-decoding by the Viterbi decoder for executing error correction of the data corresponding to a length of a block code whose correction has not been possible yet.

1 Claim, 6 Drawing Sheets-

OTHER PUBLICATIONS

Bajcsy et al., "Iterative Decoding with Erasures in a Concatenated System with Diversity", IEEE ISCC '98, pp. 100–104.*

Calzolari et al., "CCSDS Telemetry Channel Coding: The Turbo Coding Option", 1998 CCSDS Workshop, pp. 5/1–5/6.*

Seshadri et al., "Generalized Viterbi Algorithms for Error Detection with Convolutional Codes", *Proceedings of the Global Telecommunications Conference and Exhibition (GLOBECOM)*, IEEE, vol. 3, Nov. 27, 1989, pp. 1534–1538.

* cited by examiner

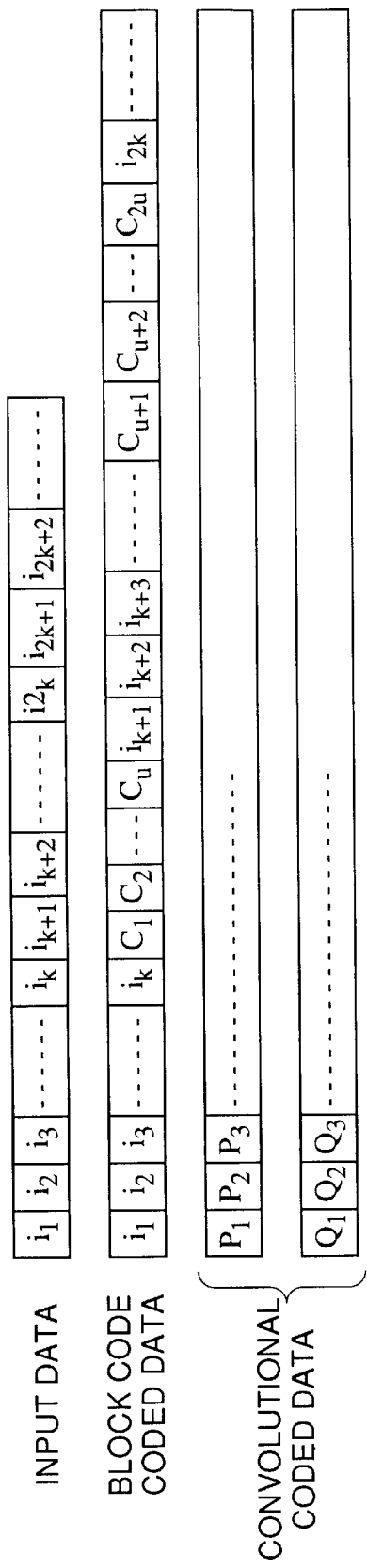
Fig. 5
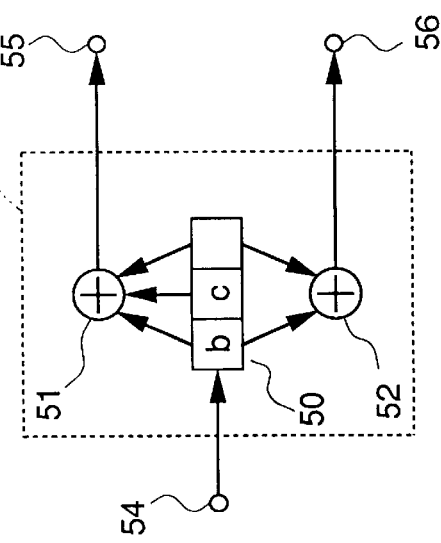
Fig. 9
Fig. 4

DATA ERROR CORRECTION SYSTEM

BACKGROUND OF THE INVENTION

1. Field of the Invention

The present invention relates to a data error correction system which is used for improving the link quality of a transmission link by coding data into error correction codes so as to correct errors generated in the transmission link in so far as possible, in the fields of satellite communication and space communication which transmit data such as compressed image data.

2. Background Art

There is a data error correction method in digital communication called the "Viterbi decoding method" (G. D. Forney Jr., "The Viterbi Algorithm", 3 Proceedings of IEEE, vol. 61, pp. 268–278, March 1973). Improved error correction for encoded data by a combination of a convolutional code with another code is proposed by G. D. Forney Jr. Another code generally used is a concatenation of a convolutional code and a Reed-Solomon code which is obtained by combining a block convolutional coder and a Reed-Solomon coder. The decoding of the encoded data is carried out based on the Viterbi algorithm and the Viterbi decoded data is subjected to Reed-Solomon decoding.

However, since the error correction is executed independently by the Viterbi decoder and by the Reed-Solomon decoder, the above-described conventional data error correction system has a problem in that the conventional error correction system is not capable of sufficient error correction effect to improve the line quality of some transmission links.

It is therefore an object of the present invention to solve the above described problem, and to provide an error correction system which is capable of correcting data errors iteratively, sufficiently correcting bit errors generated in the transmission link, and improving the link quality.

SUMMARY OF THE INVENTION

According to the first aspect of the present invention, a data error correction system comprises: a buffer for receiving data which are encoded by a block encoder and a convolutional encoder; a Viterbi decoder for decoding a block of data designated from the data output from said buffer in accordance with the Viterbi algorithm; a block decoder, which starts decoding when it receives data corresponding to a block code length from said Viterbi decoder, for executing the error correction when possible and outputting the result and a control circuit which controls the re-decoding by said Viterbi decoder so as to make it possible to execute decoding by said Viterbi decoder for data corresponding to the block code length whose error could not be corrected yet, based on an error detection signal output by said block decoder, when the error correction has not been completed.

According to the second aspect of the present invention, the data error correction system according to the first aspect is provided, wherein the data error correction system allows repeated executions of decoding by the Viterbi decoder and the block decoder responsive to the error detection signal until the error correction is completed.

According to the third aspect of the present invention, the data error correction system according to the first aspect is provided, wherein data input into said buffer is the bit data expressed by soft decision representation.

According to the fourth aspect of the present invention, the data error correction system according to the first aspect is provided, wherein said Viterbi decoder comprises: a branch-metric generator for obtaining a probability of each transmittable symbol having been transmitted, when the data for respective symbols output from said buffer are received; a path-metric register which stores the cumulative metrics of the survival paths; an addition comparison selection circuit for outputting a path-metric value at the n-th state and a selection information at the n-th state selected by executing comparison, addition, and selection of outputs of said path-metric register and said branch-metric register at every symbol time along the trellis a maximum likelihood path state number order detector for obtaining a state number which has the maximum path-metric value among path-metric values at the n-th state output from said addition comparison selection circuit; a path memory for storing at every symbol time the selection information at the n-th state output from said addition comparison selection circuit; a trace back circuit for outputting a decoded data with (u+k) bits from the last bit that arrived when tracing back to the past from the state number output of the maximum likelihood state number order detector at every (u+k)-th time, when the encoded data are divided into data having a length of k bits and the data with u bit length is added to the divided data having k bit length as the redundancy data; and a decoding control circuit for allowing execution of re-decoding when receiving a control signal from said control circuit.

BRIEF DESCRIPTION OF THE DRAWINGS

FIG. 4 is a conceptual diagram showing the convolutional encoder for explaining the present invention.

FIG. 5 is a diagram explaining the data series in respective blocks in FIG. 2.

FIG. 9 is a diagram for explaining the three bit soft decision data in the present invention.

DETAILED DESCRIPTION OF THE INVENTION

Hereinafter, an embodiment of the present invention will be described with reference to the attached drawings.

Figure 1:
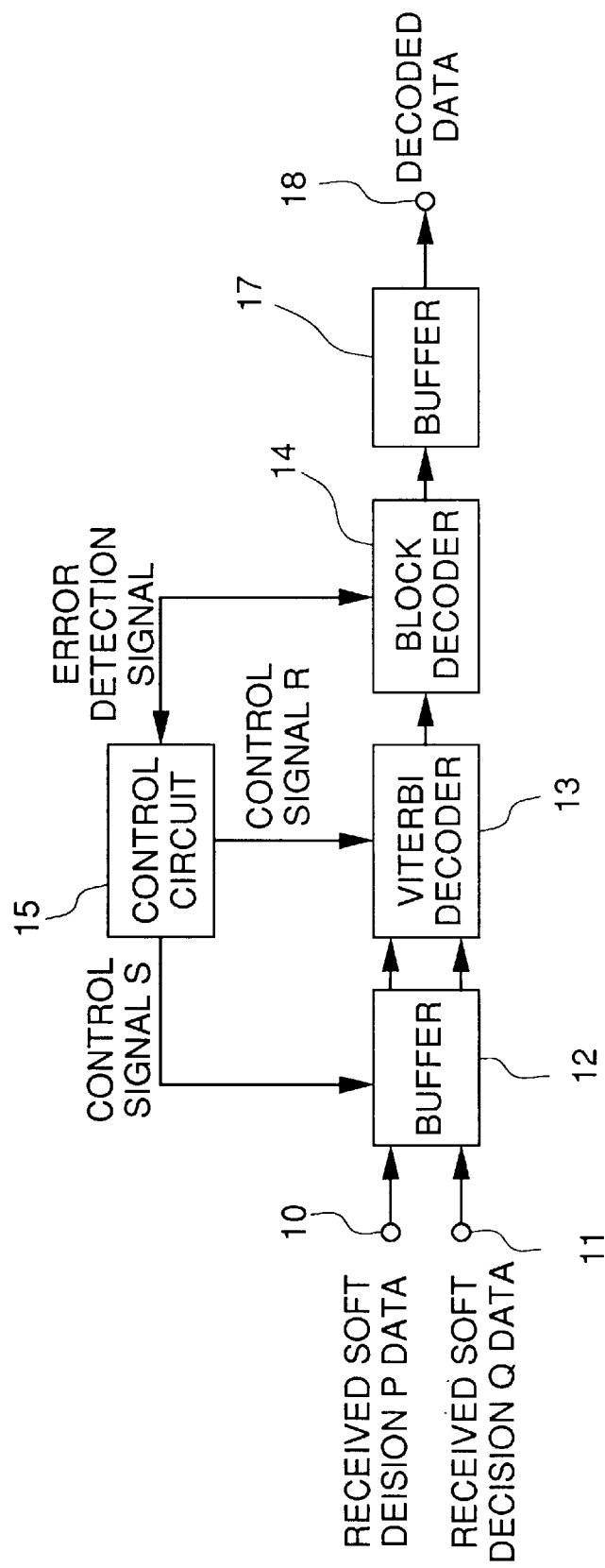
FIG. 1 is a block diagram showing a data correction system according to an embodiment of the present invention.

FIG. 1 shows a data error correction system of the present invention. Numerals 10 and 11 denote input terminals for inputting received P data and received Q data, respectively; 12 denotes a buffer for inputting the output of a convolutional encoder, that is, received P data and received Q data, which contains a bit error generated in a transmission line; 13 denotes a Viterbi decoder which executes decoding of an input of the designated received P data and designated received Q data output from the buffer 12 according to the Viterbi algorithm; 14 denotes a block decoder which executes decoding of the decoding data having a length corresponding to a block code of the Viterbi decoder 13; 17 is a buffer for outputting the decoded data from the block decoder 14 to the outside.

Figure 3:
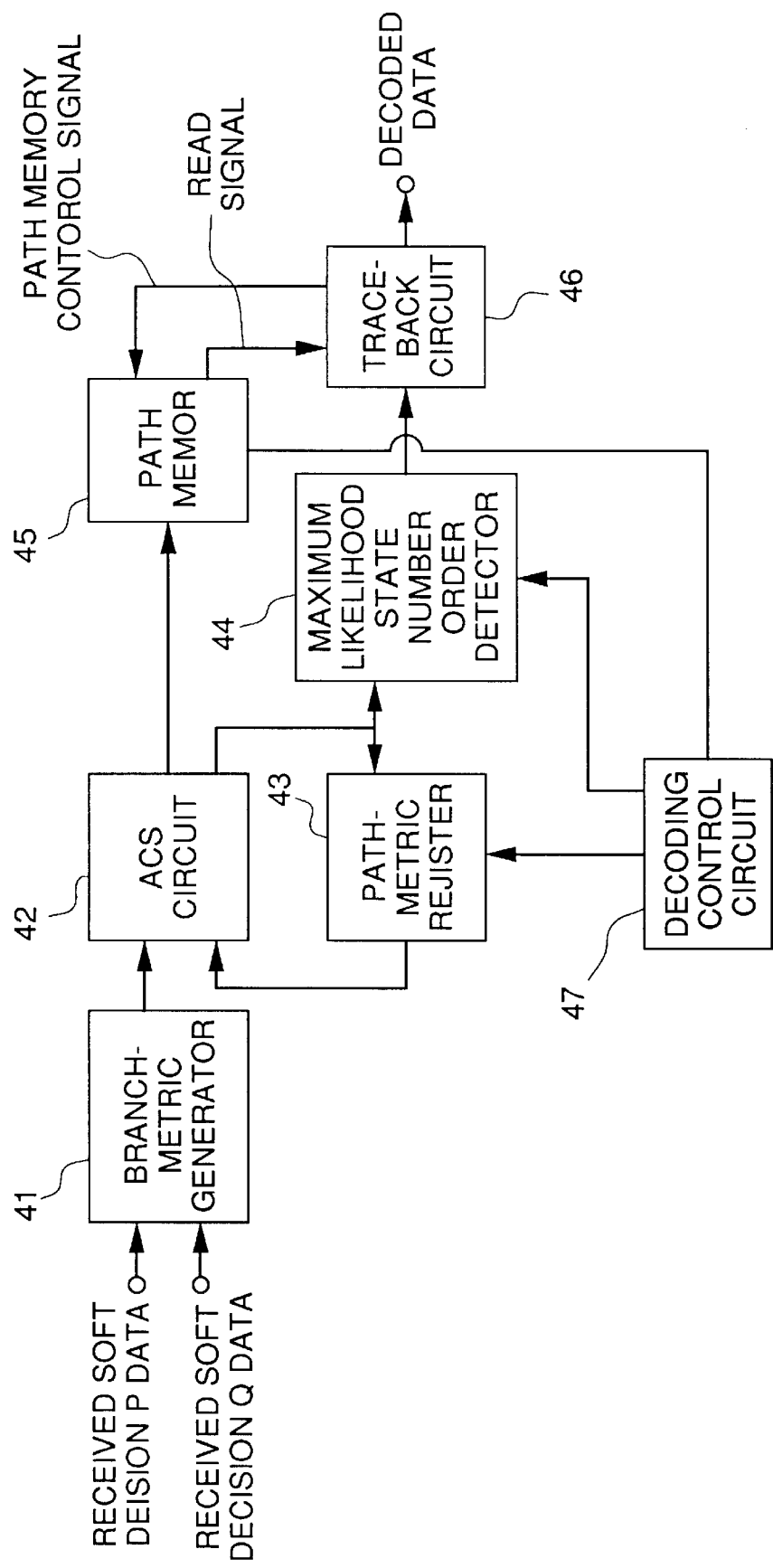
FIG. 3 is a block diagram showing the Viterbi decoder in FIG. 1.

The numeral 15 denotes a control circuit which receives a detection signal that is output from the block decoder 14 when it is decided that the error cannot be corrected, outputs a control signal R such that the Viterbi decoder 13 repetitively executes re-decoding, and outputs a control signal for the Viterbi decoder to output the designated received P data, and the designated received Q data to the buffer 12. The Viterbi decoder 13 is formed as shown in FIG. 3. In FIG. 3, 14 denotes a branch-metric generator for obtaining probabilities of each symbol being transmitted, when data for every symbol output from the buffer 12 is received; 43 denotes a path-metric register which stores a cumulative metric of surviving paths; 42 is an addition comparison selection circuit (hereinafter, called ACS circuit) for executing addition (ADD), comparison (COMPARE), and selection (SELECT) for the output from the branch-metric generator 41 at every symbol time and the output of the path-metric register 43 according to the trellis diagram, and for outputting the thus compared and selected n-state path-metric value and n-state selection information.

Furthermore, in FIG. 3, 44 is a maximum likelihood state number order 15 detector for obtaining the state number having the maximum path-metric value among path-metric values in the n-state output of the ACS circuit 42; 45 is a path memory for storing the selection information on the output at the n-state from the ACS circuit 42 at every symbol time; 46 is a trace back circuit which outputs the (u+k) bits as the decoded data from the last bit finally reached by tracing the path memory 45 from the state number output from the maximum likelihood path state number order detector 44 toward the past for g symbol times; 47 denotes a re-decoding circuit 15 for executing re-decoding when receiving the control signal R from the control circuit shown in FIG. 1.

Next, the operation will be described. For explanatory purposes, it is assumed that the block encoder 32 divides the data every k bits, and adds u bits as the redundancy bits to each k bits, and it is also assumed that the coding ratio R and the restriction length K of the convolutional encoder 33 are fixed at R=½ and K=3, respectively.

Figure 2:
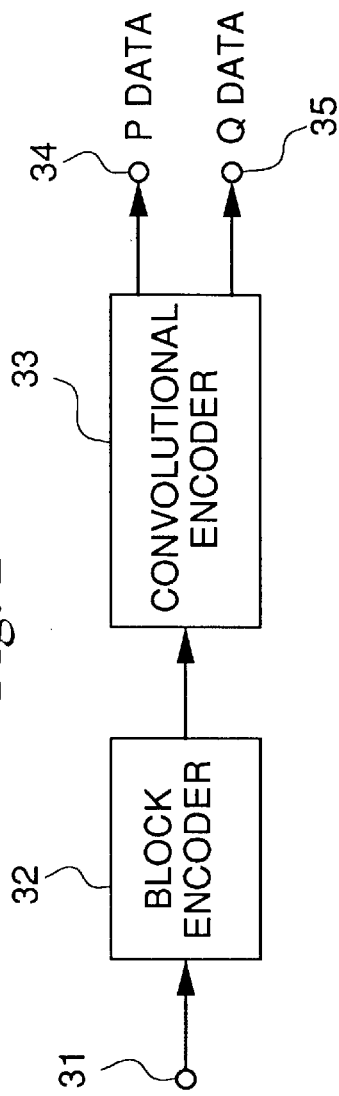
FIG. 2 is a block diagram for explaining the error correction encoder.

First, an explanation of the error correction encoder at the sending side is described. At the sending side, as shown in FIG. 2, data is input into the block encoder 32 through the input terminal 31.

As shown in FIG. 5, the block encoder 32 executes encoding so as to add u bits of the redundancy, c1, c2, . . . , cu to the first k bits, i1, i2, . . . ik, and add cu+i, cu+2, . . . , c2u bits as the redundancy bits to the following k bits, ik+1, ik+2, . . . , i2k.

Subsequently, the output of the block encoder 32 is encoded by the convolutional encoder 33 constructed by a three stage shift register and an exclusive OR. That is, in this convolutional encoder 33, the output of the block encoder 32, as shown in FIG. 4, is entered into the shift register 50 at every symbol time, and the outputs of designated stages are subjected to logic processing at exclusive ORs 51 and 52, and P data, P1, P2, . . . and Q data, Qi, Q2, . . . are output from the output terminals 55 and 56. P data and Q data which are the output of the convolutional encoder 33 are transmitted for inputting to the buffer 12 through the input terminals 10 and 11 of the error correction decoder. At this time, those P data and Q data are represented by the soft decision expression for transmitting to the Viterbi decoder 13 how these data are varied by the noise generated during transmission. FIG. 9 illustrates the soft decision representation of "0" and "1" by three bits.

Figure 6:
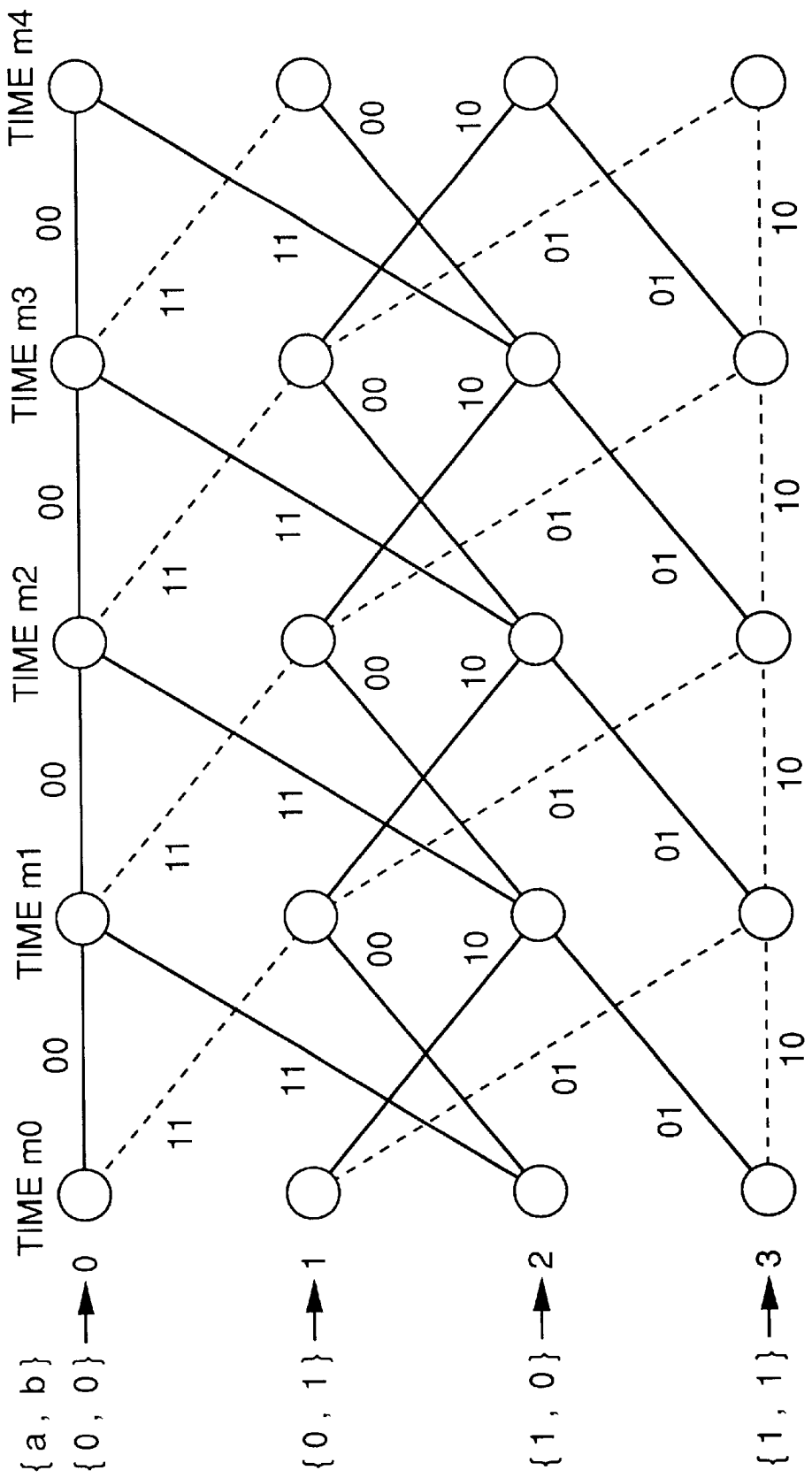
FIG. 6 is a diagram for explaining the trellis representation of the convolutional encoder in FIG. 4.

Next, the operation of the Viterbi decoder 13 is described. FIG. 6 illustrates a trellis representation of the convolutional encoder 33. {0, 0}, {0, 1}, {1, 0}, and {1, i} in the left column of FIG. 6 represent the contents of the first and second steps {a, b}. The values shown on the right side of the arrows are obtained by calculating the formula (a x 2+b), and these values are called hereinafter the state number. FIG. 6 is explained briefly as follows. When the state number is 0, and if the data input to the convolutional encoder 33 is "0", transition occurs to the state number 0, and the output value "0 0" (the numeral shown on the line indicating the transition from the state number 0 to the state number 0) of the P data and Q data are output. When the input data is "1", transition occurs to the state number 1 and the output value "1 1" is output. Regarding the other state numbers, a destination of the transition is determined in accordance with the data input into the convolutional encoder 33, and the output values of the P data and Q data are shown on the transition lines. The Viterbi decoder carries out a decoding processing according to the diagram shown by the trellis representation.

That is, when the soft decision P data and Q data are input into the Viterbi decoder 13 from the buffer 12 by a control signal S from the control circuit 15, the branch metric generator 41 calculates branch metrics for the soft decision data P1 and Qi, that is, probabilities of the transmission data set (P, Q) has been (0, 0), (1, 0), (0, 1), (1,1). For soft decision data P1 and Qi, the branch metric at the time when the transmission data set is (0, 0) is made $\lambda 0$, the branch metric when the transmission data set is (1, 0) is $\lambda 1$, the branch metric for the transmission data set of (0, 1) is made $\lambda 2$, and the branch metric for the transmission data set of (1, 1) is made $\lambda 3$.

Figure 7:
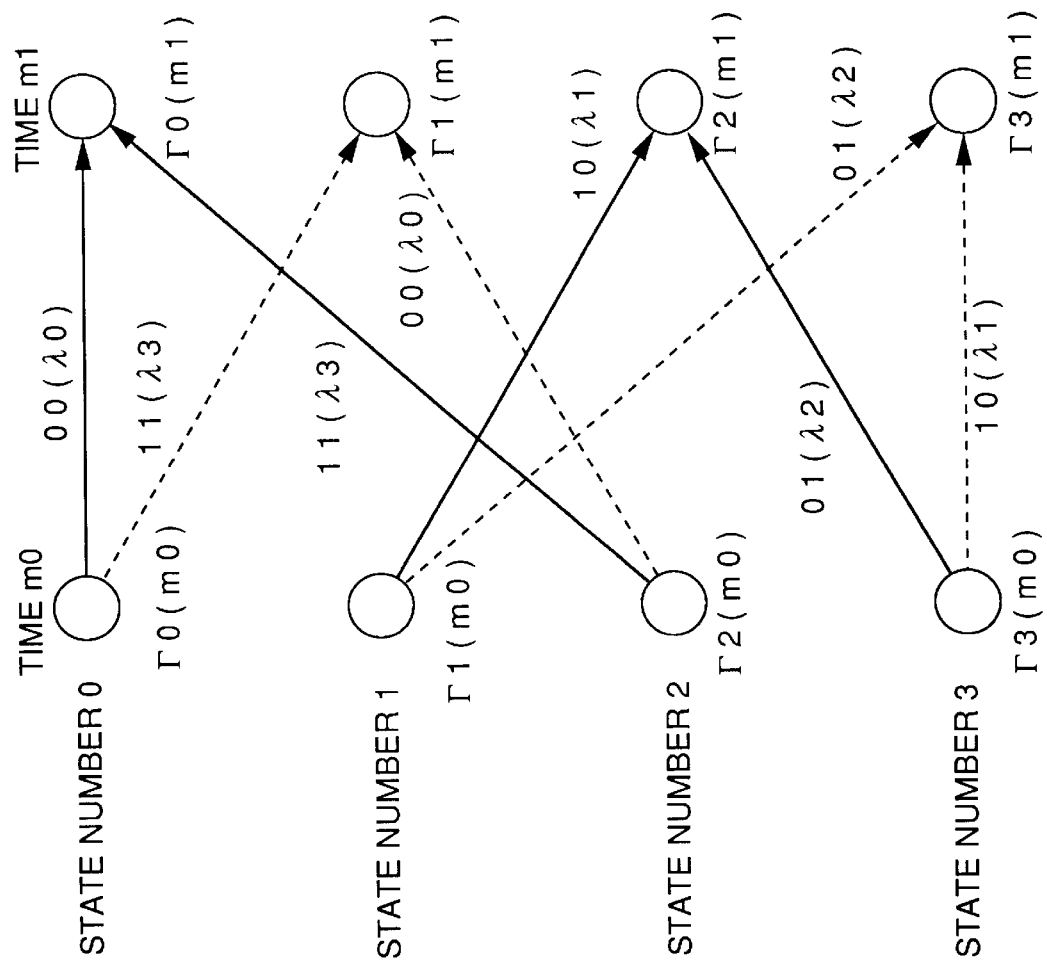
FIG. 7 is a diagram for explaining the structure of the ACS circuit in FIG. 3.

The branch-metric generator 41 outputs these branch-metrics $\lambda 0$, $\lambda 1$, $\lambda 2$, and $\lambda 3$ to the ACS circuit 42. As shown in FIG. 7, the path-metric values of each state number at time mO are made $\Gamma 0$ (mO), $\Gamma 1$ (mO), $\Gamma 2$ (mO), and $\Gamma 3$ (mO). The path-metric register 43 outputs these path-metrics $\Gamma 0$ (mO), $\Gamma 1$ (mO), $\Gamma 2$ (mO), and $\Gamma 3$ (mO) to the ACS circuit 42. The ACS circuit 42 carries out an operation based on the trellis representation shown in FIG. 7. That is, the transition merging in the state number 0 at time ml includes those from the state number 0 and the state number 2. Since the output data from the convolutional encoder at the time of the transition from the state number 0 is "0 0", the branch metric at this time is $\lambda 0$, and since the output data from the convolutional encoder at time of the transition from the state number 2 is "1 1", the branch metrics is $\lambda 3$. The path-metrics of the state numbers 0 and 2 at time mO are $\Gamma 0$ (mO) and $\Gamma 2$ (mO), and after carrying out computation of $\Gamma 0$ (mO)+$\lambda 0$ and $\Gamma 2$ (mO)+$\lambda 3$, the larger value obtained by the above computation is stored in the path-metric register 43 as the path-metric value $\Gamma 0$ (ml) of the state number 0 at time ml.

The branch values selected simultaneously (the value is "0" when the path indicated by the solid line is selected, and the value is "1" when the path indicated by the broken line is selected) are stored in a path memory 45 as the branch value SO (ml). Following, the path-metric values $\Gamma 1$ (ml), $\Gamma 2$ (ml), $\Gamma 3$ (ml) and branch values S1(ml), S2(ml), S3(ml) at time ml are obtained by the same processing, the path-metric values are stored in the path-metric register 43, and the branch values are stored in a path memory 45. The path memory 45 has a memory capacity capable of storing the branch information within the time period mg. The ACS circuit 42 outputs the path-metric values $\Gamma 0$ (ml), $\Gamma 1$ (ml), $\Gamma 2$ (ml), and $\Gamma 3$ (ml) at time ml to the path-metric register 6 as well as the maximum likelihood path state number order detector 44. This is the end of a series of processes (hereinafter, called ACS processing). When the next soft decision data P2, and Q2 are input, the ACS processing described above is repeated. When the processing is completed, the control circuit 47 gives the next order.

Figure 8:
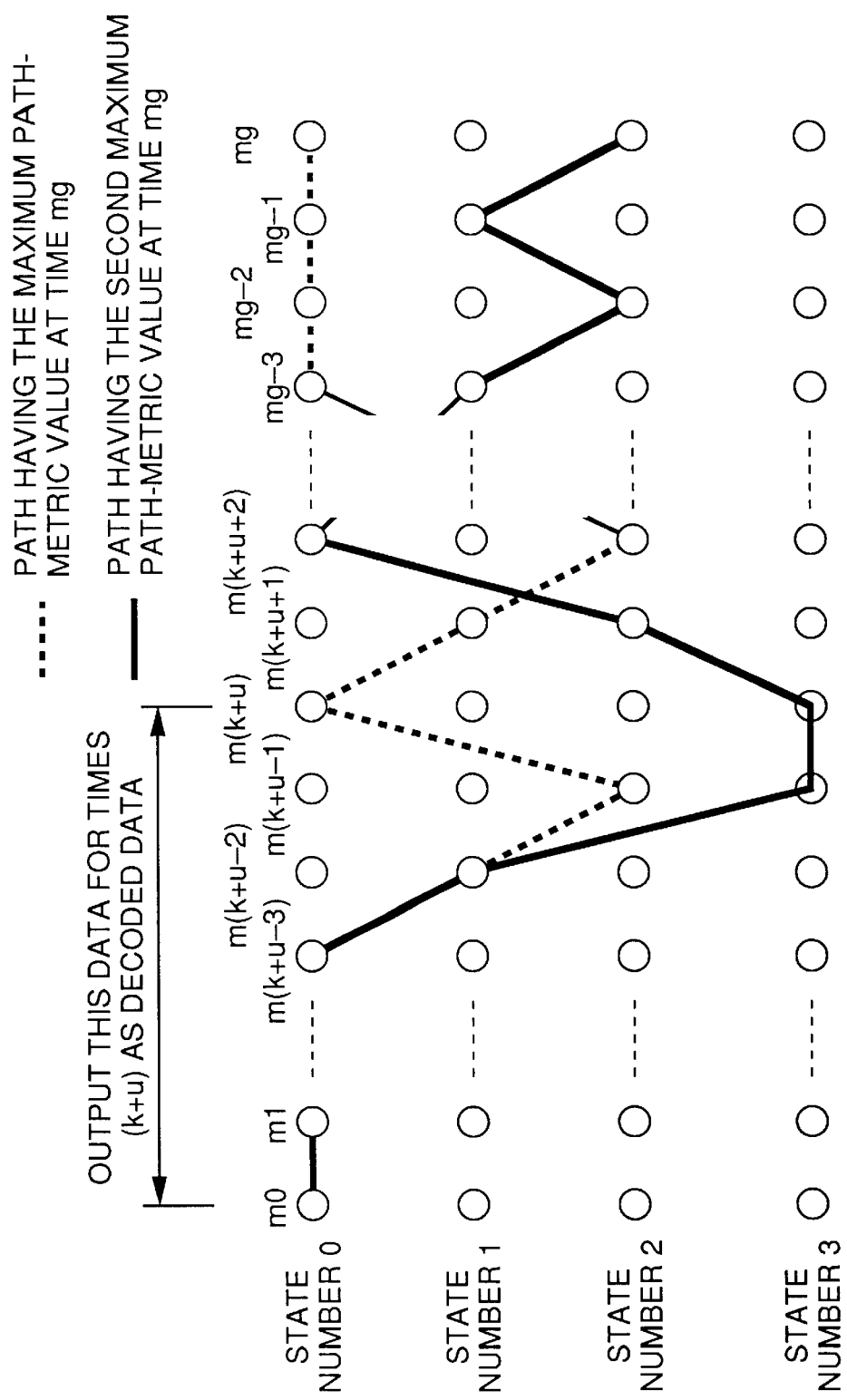
FIG. 8 is a diagram for explaining the trellis representation of the trace back processing in the present invention.

The maximum likelihood path state number order detector 44 outputs to the trace-back circuit 46 the state number having the maximum path-metric values among the maximum likelihood path-metric values Γ0 (mg), Γ1 (mg), Γ2 (mg), and Γ3 (mg). If there are two or more state numbers which have the same maximum path-metric values, the lowest state number is selected. When the state number having the maximum path-metric values at time mg is "2", the trace-back circuit 46 traces back at time mg along the solid line the paths extending from the state number 2, having the maximum path-metric values, as shown in FIG. 8, while reading the contents of the path memory.

The trace-back circuit 46 reads the data stored at the state number 2 at time m(g−1) in the path memory 45 to examine whether the path merging to the state number is the state number 1 or the state number 3, and knows that the state number is 1. By repeating the same processing, sash the path is traced back to the time m0, and finally outputs the (k+u) bits of data (corresponding to the data from the time m1 to the time m(k+u)) obtained from the path memory 45 as the decoded data (hereinafter, called trace back processing).

Furthermore, the path memory 45 is provided which can carry out a reading operation in the ACS processing and a reading operation in the trace-back processing simultaneously. Since the path memory is configured in a ring structure having a memory capacity for the time period of (g+f), the necessary data are not replaced by the ACS processing. Whenever the ACS processing is carried out for the time period g, the decoded data are output after the trace-back processing. The (k+u) bits of decoded data from the Viterbi decoder 13 are delivered to the block decoder 14.

The block decoder 14 starts decoding for the (k+u) bits of decoded data, 20 and if the error can be corrected, only k bits of an image data are output to the buffer 17. If the error correction is not possible, the error detection signal is sent to the control circuit 15. When the control circuit 15 receives the error detection signal, the control signal R is then sent to the control circuit 47 in the Viterbi decoder 13.

When the control circuit 47 receives the control signal R, the maximum likelihood path state number order detector 44 makes the trace-back circuit 46 output the state number having the next largest path-metric value. If there are two or more state numbers having the same maximum path-metric values, the next lowest number to the previous one is selected. If the state number having the next maximum path-metric value following the state number 2 having the maximum number at time mg is "0", the trace-back circuit 46 traces back the path extending from the state number 2, while reading the contents of the path memory 45. The trace back circuit 46 reads the data stored at the state number 0 at time m(g−1) in the path memory 45 to examine whether the path merging to the state number 0 is the state number 0 or the state number 2, and knows that the state number is 0.

The trace back circuit 46 traces back the path to the time m0 by repeating the same operation, and finally outputs the (k+u) segments of data (corresponding to the data from time m1 to time m(k+u)) as the decoded data. The block decoder 14 receives the (k+u) bits of decoded data from the Viterbi decoder 13, and starts decoding. If the error correction is executed, only k bits of data information are output to the buffer 17. If the error is not corrected, the error detection data is sent to the control circuit 15, and the above operations are repeated until the error is corrected or equal to the number of the state number. If the error is not corrected after the operations are repeated equal to times as the number of the state number, (k+u) bits obtained by the first trace-back processing are output to the buffer 17.

The control circuit 15 then sends the control signal 1 to the buffer 12, and the buffer 12 outputs in sequence the received soft decision P data and Q data to the Viterbi decoder 13. The Viterbi decoder 13 decodes the next (k+u) bits and examines the probability of the (k+u) bits in order to output the result to the buffer 17. The buffer 17 outputs the decoded image data through the output terminal 18. The presence of one type of buffer 12 and the presence of another type of buffer 17 are to absorb the fluctuation during decoding operation depending upon the amount of the bit errors generated in the transmission line.

In the above embodiment, although the case is described when the trace-back processing in the Viterbi decoder 13 is carried out for every (k+u) bits, it is possible to carry out the trace-back processing for a smaller unit than (k+u) bits. By reducing the unit size, it is possible to clarify the position of the error data in the (k+u) bits unit in the repeating error correction when the block decoder 14 sends the error detection signal, which results improving the error correction capability. In addition, by limiting the number of error correcting bits (for example, when an error correcting signal is capable of correcting four bits, the error correction is carried out for 3 bits and in the case of four bit error, the error detection signal is output), it is possible to clarify the unit of (u+k) bits to be corrected, which facilitates executing error correction by repeated decoding. Moreover, it is possible to reduce the scale of the circuit using a error detection code adding one parity bit without using the error correction codes.

As described above, the error correction system of the present invention comprises a block encoder, a buffer for receiving data encoded by the convolutional encoder, a Viterbi decoder for receiving the data designated by the buffer and executing decoding of the data, and a block decoder that starts decoding when it receives the data at a length of the block code length and executes if the error correction is possible. When the error correction is not possible, the system is designed such that the control circuit controls the Viterbi decoder to control execution of re-decoding for a block length of data which has been rendered impossible for error correction. Such a construction makes it possible to repeat the error correction operation after judging or evaluating the reliability of the data decoded by the Viterbi decoder, and makes it possible to correct errors generated in the transmission line, which result in improving the quality of the transmission line.

What is claimed is:

1. A data error correction system comprising:
    a buffer for receiving data that has been encoded by a block encoder and a convolutional encoder;
    a Viterbi decoder configured to decode, in accordance with the Viterbi algorithm, a designated block of data that has been output from said buffer;
    a block decoder, which starts decoding upon receiving a Viterbi-decoded block of data from said Viterbi decoder, configured to execute error correction when possible and to output the result; and
    a control circuit connected to control, when the error correction has detected an error, execution of re-decoding the designated block of data by said Viterbi decoder and re-decoding by said block decoder, based on an error detection signal output by said block decoder, wherein said Viterbi decoder comprises:

a branch-metric generator for obtaining a probability of each transmittable symbol being received, when data of each transmitted symbol output from said buffer are received;

an addition-comparison-selection circuit for outputting a path-metric value for each of n states in a trellis stage and outputting selection information selected by executing addition of outputs of a path-metric register and branch-metrics and comparison for the n states for each of a plurality of symbol interval times;

a maximum likelihood path state number order detector for obtaining a state number having the maximum path-metric value among path-metric values output from said addition comparison selection circuit, for the n states;

a path memory for storing the selection information output from said addition-comparison-selection circuit at each symbol interval time, for the n states;

a trace-back circuit for outputting (u+k) bits of decoded data from the last bits generated when tracing back from the state number output of the maximum likelihood state number order detector every (u+k)-time intervals, for data encoded by adding u bits redundancy to each k uncoded bits; and a decoding control circuit for allowing execution of re-decoding when receiving a control signal from said control circuit.

* * * * *